United States Patent [19]
Cohn

[11] 3,943,458
[45] Mar. 9, 1976

[54] REDUCING GAIN SHIFTS IN PHOTOMULTIPLIER TUBES

[75] Inventor: Charles E. Cohn, Clarendon Hills, Ill.

[73] Assignee: The United States of America as represented by the United States Energy Research & Development Administration, Washington, D.C.

[22] Filed: Oct. 24, 1974

[21] Appl. No.: 517,678

[52] U.S. Cl. .................................. 330/42; 250/207
[51] Int. Cl.[2] .......................................... H03F 1/00
[58] Field of Search .......... 330/42, 46, 49; 328/256; 250/207

[56] References Cited

UNITED STATES PATENTS 3,015,033 12/1961 Muench ............................ 250/207
3,614,646 10/1971 Hansen ............................ 330/42 X

*Primary Examiner*—James B. Mullins
*Attorney, Agent, or Firm*—Dean E. Carlson; Arthur A. Churm; Paul A. Gottlieb

[57] ABSTRACT

A means is provided for reducing gain shifts in multiplier tubes due to varying event count rates. It includes means for limiting the number of cascaded, active dynodes of the multiplier tube to a predetermined number with the last of predetermined number of dynodes being the output terminal of the tube. This output is applied to an amplifier to make up for the gain sacrificed by not totally utilizing all available active stages of the tube. Further reduction is obtained by illuminating the predetermined number of dynodes with a light source of such intensity that noise appearing at the output dynode associated with the illumination is negligible.

5 Claims, 2 Drawing Figures

REDUCING GAIN SHIFTS IN PHOTOMULTIPLIER TUBES

CONTRACTUAL ORIGIN OF THE INVENTION

The invention described herein was made in the course of, or under, a contract with the UNITED STATES ATOMIC ENERGY COMMISSION.

BACKGROUND OF THE INVENTION

One of the major uses for the typical multiplier tube is in the field of scintillation counting. When a particle of ionizing radiation leaves energy in a suitable material such as a phosphor, a weak pulse of light is emitted which is detected by the multiplier tube. The photocathode of the tube is responsive to the incident light to develop electrons in proportion to the intensity of the incident light. The electrons emitted by the photocathode are directed so they strike an electrode known as the first dynode. The energy of incident electrons is given to electrons in the dynode and, on an average, several electrons are emitted from the surface of the dynode for each incident electron. This process is known as secondary emission and results in a net multiplication or gain in the number of electrons per radiation event. The emitted electrons are then directed to a second dynode where their number is again multiplied by the secondary emission process. Further multiplication takes place at succeeding dynodes until the electrons are collected at the final dynode or the tube anode. With 10 or more dynodes the multiplication factor of the tube or gain can be very great, up to $10^8$.

One particular problem associated with multiplier scintillation detectors is that as the rate at which radiation events to which the tube is to be responsive varies, shifts in the value of the multiplication factor or gain of the tube occur. Thus for one rate of occurrence of radiation events the gain of the tube will reach an equilibrium gain of one value, while for another rate the tube will reach another gain. These gain shifts are characterized not only by different tube outputs but also by a long time constant for the tube to reach the equilibrium gain. This necessitates continual monitoring and recalibration of the tube to utilize tube output amplitude for analytical purposes.

It is therefore an object of this invention to provide a means of operating a multiplier tube with reduced gain shifts due to varying event count rates.

Another object of this invention is to reduce the time constant associated with the multiplier tube reaching an equilibrium gain in response to varying event count rates.

SUMMARY OF THE INVENTION

Varying rates at which events occur to which a multiplier tube is responsive cause shifts in the magnitude of the gain of the tube. Reduction in gain shift is achieved by providing means for reducing the number of cascaded, active dynodes of the tube to a predetermined number with the last of the predetermined number of dynodes being the output terminal of the tube. Compensation for the reduced gain in the tube due to the smaller number of active dynodes is attained by applying the output of the tube to an amplifier, preferably an amplifier of high input impedance and low noise. Further reduction of gain shift and minimization of the time for the tube to reach equilibrium gain is achieved by illuminating the active dynodes with a light. The level of illumination is limited so that noise associated with the light, appearing at the output dynode, is negligible.

DETAILED DESCRIPTION

Figure 1:
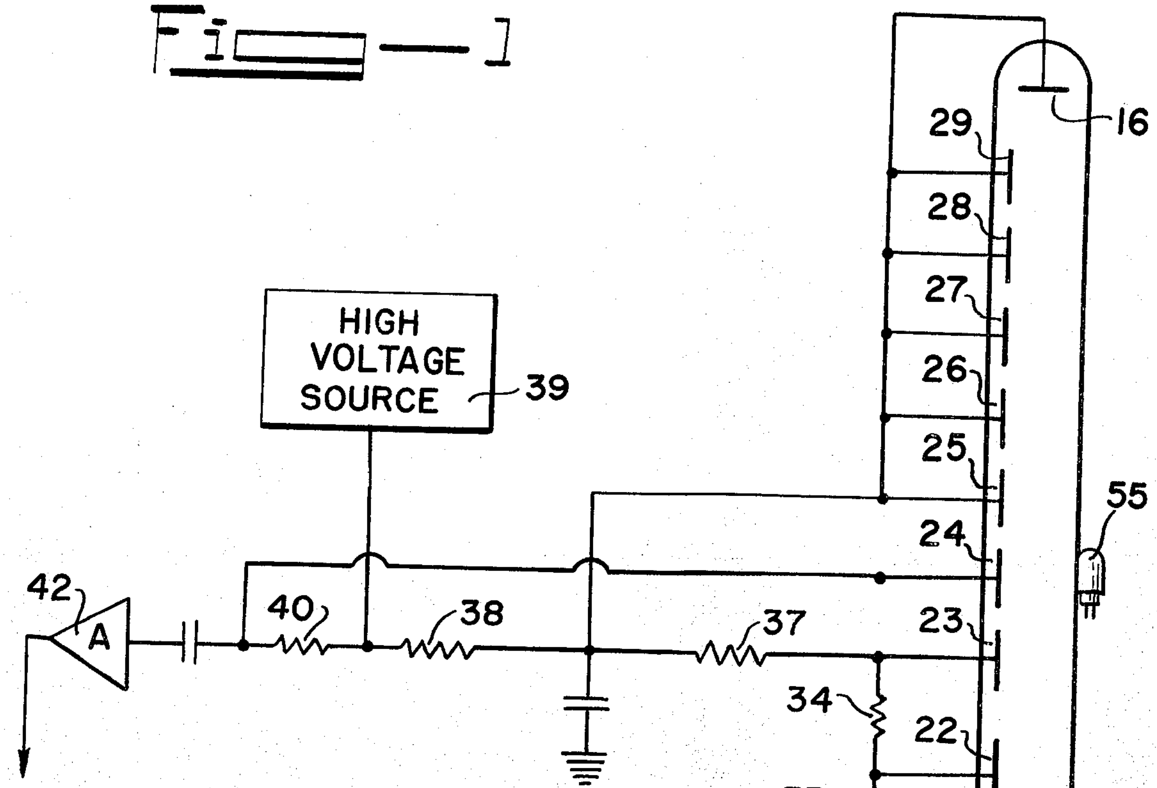
FIG. 1 is a schematic diagram of a photomultiplier tube circuit embodying the principles of this invention.
Figure 1:
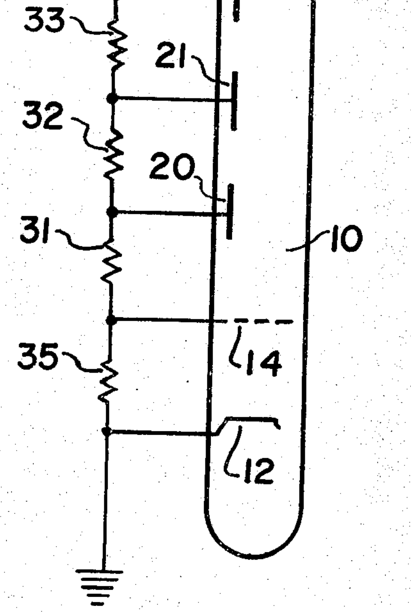

Referring to FIG. 1 there is shown a schematic diagram of a typical multiplier tube circuit, embodying the principles of this invention. In general, a multiplier tube 10 is provided with a photocathode 12, a focusing grid 14, a plurality of dynodes Nos. 20–29 and an anode 16. In the embodiment illustrated in FIG. 1, the multiplier tube has a series of 10 cascaded dynodes, Nos. 20–29. It is to be understood that a multiplier tube with any number of dynodes may be used to practice this invention.

While there are various types of dynode structures, they all generally follow the same principles of operation. When the appropriate potentials are applied to each dynode to develop electrostatic fields, electrons emitted by one dynode strike the next succeeding dynode of the cascaded series of dynodes and do not miss a stage of multiplication or strike unintended tube parts. The initial electrons are developed by the photocathode 12 in response to a radiation event as previously described and are directed to the first dynode by the operation of photocathode 12 or by a focusing grid 14. The potentials for each dynode are obtained by means of a resistor chain. When a light pulse occurs to which the photocathode is responsive, electrons are thereby emitted according to the quantity and magnitude of the light pulses. It has been observed that as the quantity or rate of occcurrence of light pulses varies the magnitude of amplification or gain of the multiplier tube shifts to a new equilibrium output gain, that is the gain does not remain constant. Each individual dynode of the tube introduces a particular amount of gain shift with each successive dynode of the series introducing its own shift and multiplying the shift of previous dynodes. In addition, the time taken by the tube to reach the equilibrium gain is relatively long. During this time the gain of the tube is constantly changing. These gain shifts are a serious inconvenience necessitating constant checking and calibration of the tube.

It has been observed that significant reduction in gain shifts associated with varying event count rates can be obtained by operating the multiplier tube with a reduced number of active secondary emission stages, and making up the gain with a low noise amplifier. The desirable number of active stages of the tube varies depending upon the gain realizable per active dynode stage and the total gain needed in the output of the multiplier tube to minimize the effect of the amplifier noise. For a typical tube with 10–14 dynodes and a high output light level scintillator such as a sodium iodide scintillator 5 is the desirable number of active stages. For the embodiment shown in FIG. 1 there is shown five active stages, dynodes 20 through 24, with dynode 24 acting as the anode or collecting dynode of the tube. The collecting dynode 24 is the output terminal and the other dynodes 25–29 and anode 16 are made nonactive. The active or nonactive state of each dynode is determined by the biasing which is provided by a resistor chain including resistors 31–34 which bias the active stages and resistor 35 which controls biasing between photocathode 12 and grid 14. Resistors 37 and 38 provide the necessary biasing for the nonactive dynodes 25–29 and anode 16 to prevent the nonactive stages from attracting electrons. Since dynode 24, the fifth dynode of the series, is to be the output dynode, it is biased by a load resistor 40. Typical values for the resistors are: for resistor 35, 100 K ohms, for resistors 31–34, 50 K ohms, for resistor 37, 45 K ohms, for resistor 38, 5 K ohms and for resistor 40, 100 megohms. The resistor chain is coupled to a positive high-voltage source 39 of, for example, 500 volts to provide the biasing. The output of the dynode 24 is applied to amplifier 42. The output of amplifier 42 will be proportional to the output of the photomultiplier tube with reduced gain shifts.

Good results were obtained with amplifier 42 being of high input impedance, such as a charge sensitive amplifier (CSA). A CSA is a high input imnpedance capacitive-feedback amplifier which is responsive to charges applied to it, developing an output voltage proportional to the charge. As indicated above, the output gain of amplifier 42 must be sufficient to compensate for the reduced gain of the multiplier tube so that the final gain of the tube and amplifier combination is at a desirable value. Good results are obtained by operating a CSA with as low an equivalent input noise as possible. For example, a typical CSA gave best results with noise equivalent to an RMS uncertainty in pulse height of no more than 1000 electron charges of the input. With this arrangement, gain shifts were seen to be reduced from approximately 90 parts to two or three parts out of 700 for event rate shifts from 40 events per second to 14,000 events per second. However, the long time constant for the output of the tube to reach an equilibrium gain was not entirely eliminated.

Figure 2:
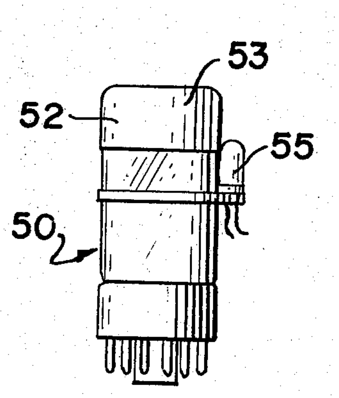
FIG. 2 is a drawing of the photomultiplier tube with a light source attached.

Referring to FIG. 1 and FIG. 2, there is shown a means for further reducing gain shifts and for reducing the long time constant associated with the tube reaching an equilibrium gain. A typical multiplier tube 50 is generally provided with a metallized area 52 on the inside of the tube's glass envelope near the window end 53 of the tube with the rest of the tube envelope being transparent. Typical operation of the tube usually involves covering the transparent portion with opaque material, such as opaque tape, to prevent outside light from impinging on the interior of the tubes and causing noise. To reduce the time constant associated with gain shifts, a light bulb 55 is attached, such as with tape, to the side of the tube along the transparent portion of the tube. The tube is then covered in the normal manner while allowing bulb 55 to illuminate the dynodes. The position of the light is such that with the light providing the necessary illumination, either directly or by reflection within the tube, at least the active dynode stages of the multiplier tube are illuminated. The photocathode should not be illuminated as this will greatly increase to be background noise. The level of illumination is the highest that will not produce an appreciable increase in background noise from the multiplier over the normal background noise resulting from thermionic emission from the cathode. A bulb illuminated to a dim red glow on the filament did not appreciably add to system noise and provided the necessary illumination. In particular, a No. 1829 bulb operated at 4 volts provided adequate illumination. The bulb and the transparent portion are covered as in normal multiplier tube operation, so that the only illumination provided to the dynodes is from bulb 55. Operated with reduced number of stages and amplification with the light, gain shift was reduced to one or two parts out of 700, with greatly reduced time for the tube to reach equilibrium gain and with noise associated with the light of about 10% of the other tube background noise such as that from the cathode. Operation without reduced number of stages and amplification, but with the light illuminating the dynodes produced no appreciable reduction in gain shift or response time.

Note that the principles of operation herein disclosed are applicable to electron multiplier tubes as well as photomultiplier tubes. An electron multiplier tube is similar in design and operation to a photomultiplier tube except that an electron multiplier tube is not provided with a photocathode for generating electrons. Instead an exterior source of electrons must be provided which directs electrons to the first dynode of the electron multiplier tube at which point the secondary emission process with the cascaded series of dynodes occurs as described above. Thus with use of a reduced number of active dynodes, an amplifier and an illumination source gain shift in an electron multiplier tube may be reduced.

The embodiments of the invention in which an exclusive property or privilege is claimed are defined as follows:

1. A device for reducing gain shift in a multiplier tube due to varying event count rates, the multiplier tube having dynodes arrayed in a cascaded series such that with appropriate biasing any dynode of the cascaded series is capable of being responsive to incident electrons directed thereto to emit secondary electrons at a rate amplified from the rate at which incident electrons are applied thereto, the secondary electrons emitted by one dynode being applied as incident electrons to the next consecutive dynode of the cascaded series, with the last dynode of the series being the output terminal, comprising: means coupled to the dynodes for limiting the number of consecutive active dynodes of the cascaded series to a predetermined number by rendering inactive at least one dynode of said cascaded series, with the last of the predetermined number of said consecutive active dynodes being the output terminal of the tube, and an amplifier coupled to said last consecutive active dynode and being responsive to the number of electrons incident on said last consecutive dynode to develop an output signal whose magnitude is proportional to and the amplification of the number of electrons incident on said last consecutive dynode.

2. The device of claim 1, further including a light source for illuminating said predetermined number of dynodes such that a background noise appearing at the output dynode associated with the illumination of the dynodes by said light source is not more than 10% of all other tube background noise.

3. The device of claim 2 wherein the multiplier has at least 10 dynodes arrayed in a cascaded series and said predetermined number of active stages is five.

4. The device of claim 3, wherein said light source is glowing at a dull red glow.

5. The device of claim 3, wherein said amplifier is a charge sensitive amplifier operated with noise equivalent to an RMS uncertainty of no more than 1000 charges at the input.

* * * * *